United States Patent [19]

Acker

[11] Patent Number: 4,672,644
[45] Date of Patent: Jun. 9, 1987

[54] COMPENSATOR FOR CHARGE TRANSFER INEFFICIENCY IN CHARGE COUPLED DEVICES

[75] Inventor: William F. Acker, Seminole, Fla.

[73] Assignee: Honeywell Inc., Minneapolis, Minn.

[21] Appl. No.: 784,417

[22] Filed: Oct. 4, 1985

[51] Int. Cl.$^4$ .......................................... G11C 19/28
[52] U.S. Cl. ..................................... 377/58; 333/165; 328/167
[58] Field of Search .......................... 377/58; 333/165; 328/167; 357/24; 307/231, 520

[56] References Cited

U.S. PATENT DOCUMENTS 3,868,516 2/1975 Buss ........................................ 377/57
4,224,585 9/1980 Tanaka ................................... 377/58
4,539,536 9/1985 White .................................... 333/166

FOREIGN PATENT DOCUMENTS 129998 10/1980 Japan .................................... 333/165
158523 12/1981 Japan .................................... 333/165

Primary Examiner—Stanley D. Miller
Assistant Examiner—K. Ohralik
Attorney, Agent, or Firm—Robert A. Pajak

[57] ABSTRACT

A technique for compensating for charge transfer inefficiency in charge coupled devices. A convolver output is summed concurrently with a previous convolver output delayed by a sample period and weighted by a selected coefficient related to the charge transfer inefficiency.

3 Claims, 4 Drawing Figures

COMPENSATOR FOR CHARGE TRANSFER INEFFICIENCY IN CHARGE COUPLED DEVICES

The government has rights in this invention pursuant to Contract No. 81F132080, awarded by the Department of the Army.

BACKGROUND OF THE INVENTION

The invention relates to a signal analizer using charge transfer devices, and in particular to a compensator for charge transfer inefficiency distortion in charge coupled device convolvers.

Signal or wave analysis has been carried out using various types of analytical circuits. One of these types of circuits involves a mathematical process known as convolving. A general discussion of this process will be found in the third chapter of a book by Oppenheim and Willsky, entitled "Signals and System", Prentice Hall, 1983. The implementation of this process, as carried out in the present invention, involves sampling a plurality of discreet portions of a signal or wave on a real-time delayed basis and producing therefrom a summation signal having the desired characteristics which accurately may represent the input signal or wave. The apparatus for doing this is referred to herein as a convolver. The specific convolver circuitry used herein includes charge coupled devices connected in a special network, and it is to this type of circuitry that the present invention is directed.

Charge tranfer devices or charge coupled devices (CCD) comprise a series of similar semiconductor cells each having an input, an output, a capacitance for the storage of charge which represents information, and at least one control electrode for charge transfer timing control. The input of substantially each cell is coupled to the output of the preceding cell. A control means provides clock signals to control electrodes of each of the cells in a manner to control the charge transfer from one cell to the next.

Charge transfer devices similar to that just described are known and disclosed in U.S. Pat. No. 3,666,972. These devices have the drawback that during transfer of a signal charge packet or signal sample from one cell of the charge transfer device to a following cell, a residual charge remains in the preceding cell such that the magnitude of the charge packet transfer is less than the preceeding cell. As a consequence, the residual charge is added to a following signal charge packet which passes through the series of cells. The description of this problem can be found in the report of the "Third International Conference on the Technology and Application of Charge Coupled Devices" held in September, 1976 at Edingburgh, in an article by Chowaniec and Hobson on pages 227–231 entitled "An Analysis of CCD Recursive Filters With Application to MTI Radar Filters."

A charge transfer inefficiency compensator to overcome the problem described above is shown in U.S. Pat. No. 4,455,666 issued to Arthur H. M. van Roermund. In the last referred to patent, a detector is coupled to the output of one of the cells for detecting the magnitude of a signal charge packet on the output thereof. A compensation charge packet is derived from the selected cell and is fed back to a preceding cell but which lags the charge packet by one sample period.

In the specific application of a charge coupled device used in a convolver, the invention of the latter mentioned patent will not provide the necessary signal connection. This is so since in the convolver application, each of the cells in a series of cells is relatively weighted to provide the convolver output.

SUMMARY OF THE INVENTION

It is an object of the present invention to provide a compensator for charge transfer inefficiency distortion in a charge coupled device convolver having a series of charge coupled devices. In the present invention a post-compensator or a pre-compensator is utilized before and/or after the charge coupled device to provide a corrected convolver output.

In the present invention a two or more tap compensator comprises a circuit for performing the function of subtracting a convolver output concurrently with a previous convolver output delayed by one sample period and weighted by a selected coefficient related to the charge transfer efficiency of the device and the number of cells in the series of cells of the charge coupled device.

BRIEF DESCRIPTION OF THE DRAWINGS

FIG. 1 is a CCD convolver state diagram illustrating the principle of the invention of having a post-compensator.

FIG. 2 is a schematic diagram showing further details of FIG. 1.

DESCRIPTION OF THE INVENTION

Figures 1, 2:
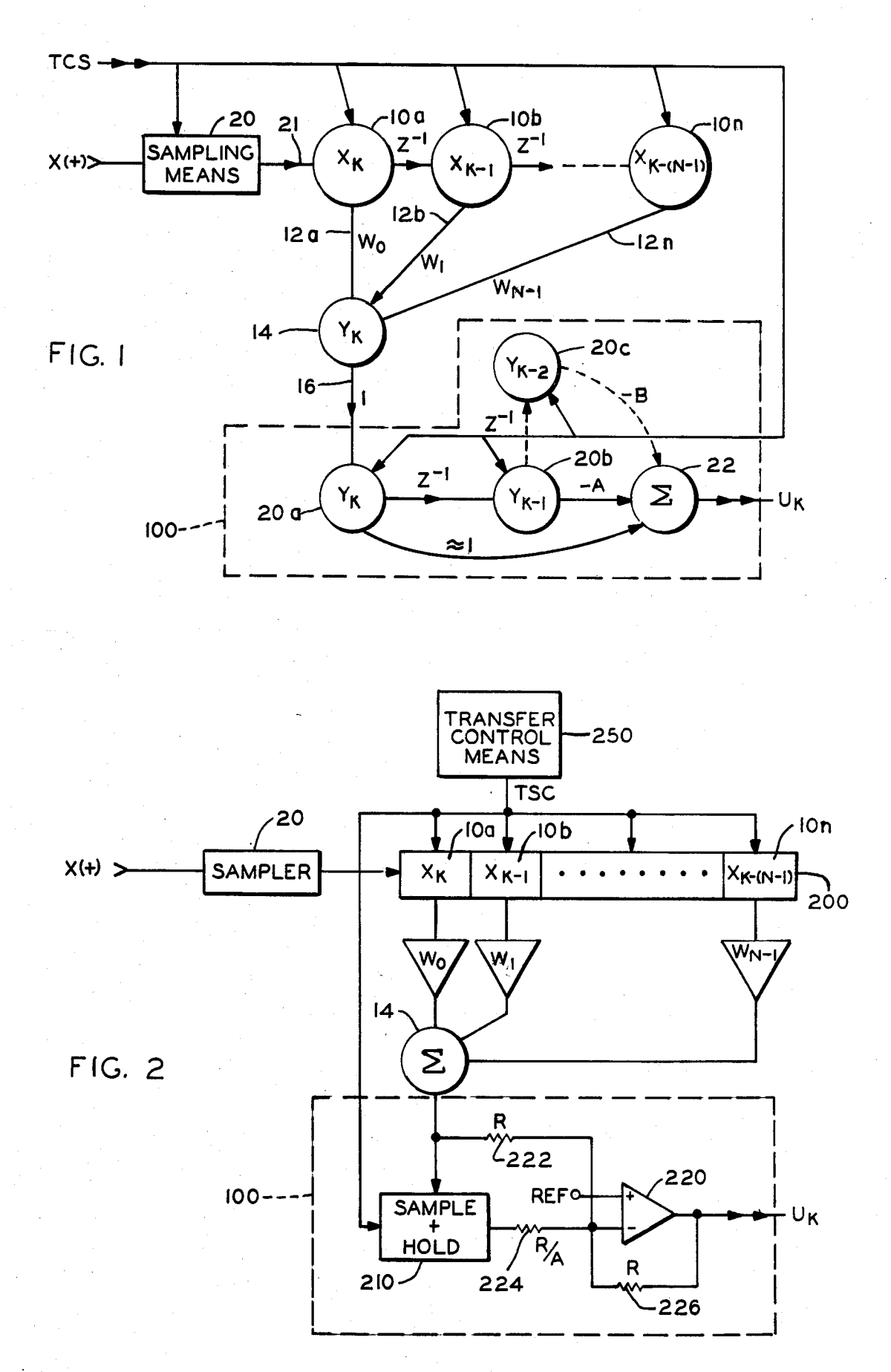
Figure 3:
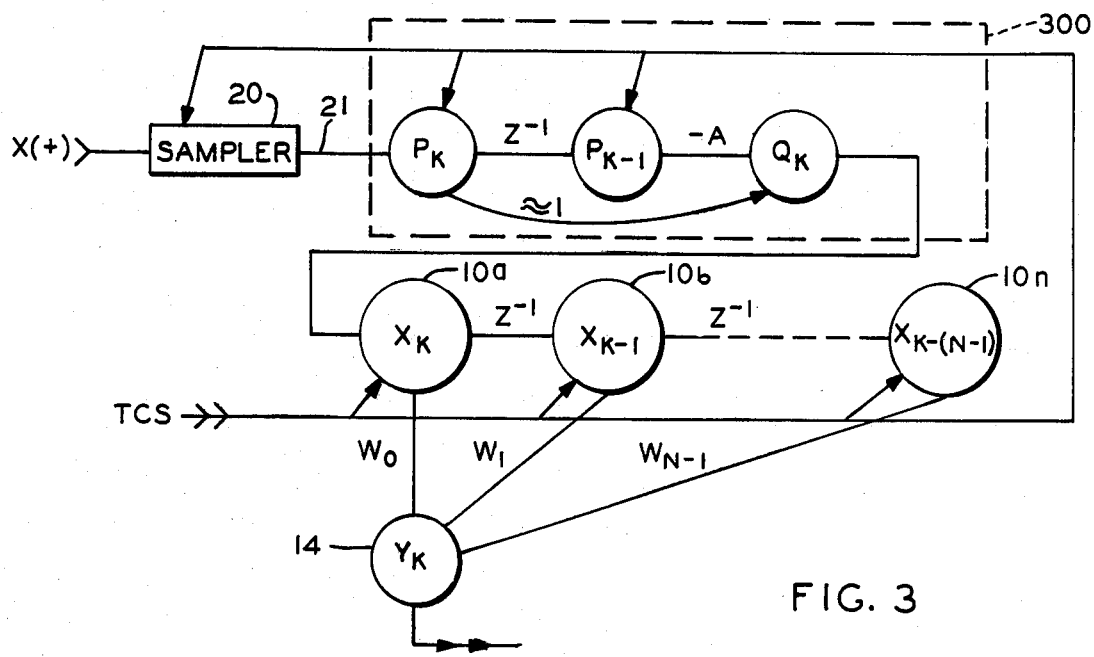
FIG. 3 is a state diagram illustrating a pre-compensator of a charge coupled device convolver.

FIG. 1 shows a state diagram illustrating a charge coupled device convolver and a post-compensator for charge transfer inefficiency of the charge coupled device. The charge coupled device contains "N" cells. The individual cells of the charge coupled device are numerically designated 10a, 10b, . . . 10n. Each of the cells has a tapped output providing a selected weighting factor of the charge packet in each cell. The tapped cell outputs are illustrated as output lines 12a, 12b, and 12n having illustrated weighting factors $W_0$, $W_1$, and $W_{n-1}$. The tapped cell outputs are summed by a summing cell 14 having an output 16 identified as $y_k$ having a convolver output expression:

$$Y_K = \sum_{i=0}^{i=N-1} x_{K-i} W_i$$

Presented to the first cell $10_a$ of the series of cells is signal x(t) through sampling means 20. Cell 10a stores a charge packet representative of signal x(t) upon command of a transfer control signal, TCS. The charge packet in cell 10a is transferred to cell 10b upon command of the transfer control signal one sample period later, $Z^{-1}$. The charge packet in cell 10b is successively shifted through the device one cell at a time after a delay of one sample period between each cell transfer determined by the transfer control signal.

The post-compensator 100 of the present invention includes charge coupled device cells 20a and 20b and a summing cell 22. The output of cell 14 is transferred to cell 20a with a tap weight of one. The output of cell 20a is transferred to cell 20b after one sample time delay, $Z^{-1}$. The output of cell 20b is presented to summing means 22 having a gain −A. Also presented to summing means 22 is the output of cell 20a having approximately unity gain.

The combination of the negative coefficient "−A" and summing circuit 22 serves the function of subtracting from the present sample of $Y_k$ the value of $Y_k$ occurring at a previous sample period. This is accomplished by summing the value of $Y_{k-1}$ times the "negative" value of the weighting coefficient "A". Circuit means 22 of compensator 100 could also be shown as a circuit means for subtracting the value of $Y_{k-1} \times A$ from the value of $Y_k$.

In the present invention, the value of A in the charge transfer inefficiency post-compensator is adjusted to minimize the effect of charge transfer inefficiency distortion in the compensated convolver output $u_K$. The value of the gain A may be described as:

$$A \approx (\alpha N/2)$$

where $\alpha$ is defined to be the charge transfer inefficiency coefficient which is the fraction of the total charge which is left behind in the single charge coupled device cell sample transfer, and N is the number of cells.

A further detailed desoription of FIG. 1 is shown in FIG. 2. The charge coupled device is designated 200 having cells 10a, 10b, ... 10n. The tap weights of FIG. 1 are illustrated as amplifiers $W_0, W_1, \ldots W_{n-1}$ which are all presented to summing means 14 to provide the convolver summation as mathematically set forth earlier. The output of the summing means 14 is presented to post-compensator 100 including a sample and hold circuit 210, amplifier 220, and resistors 222, 224, 226. The output of summing means 14 is electrically connected to the input of circuit 210 and the negative input of amplifier 220 through resistor 222. The output of sample and hold circuit 210 is also presented to the negative input of amplifier 220 through resistor 224 having value R/A, where A is as defined earlier. Lastly, also presented to the negative input of amplifier 220 is the output thereof, $u_K$, through feedback resistor 226 having value R. A transfer control means 250 has at least one output, TSC(transfer control signal), connected to each of the cells 10a, 10b, ... 10n, and also to the sample and hold circuit 210.

The function of the sample and hold circuit is to delay the sample and hold circuit output to the negative input of amplifier 220 by one sample or clock period as indicated in the state diagram of FIG. 1 and controlled by transfer control means 250. Sample and hold circuit 210 also includes a "sign" inversion at its output so as to obtain the "−" gain. The output of amplifier 220 provides the intended function of summing means 22 of FIG. 1.

The selection of resistor 224 may be determined by pretesting the charge coupled device to determine the charge transfer inefficiency coefficient. Having the charge transfer inefficiency coefficient, the value of resistor 224 may be selected by either a discreet component or by a resistance which may be laser trimmed, and the like.

The embodiments illustrated in FIGS. 1 and 2 describe what may be referred to as a two tap post-compensator. It is of course possible to provide further compensation having additional taps to further enhance the compensation. For example, consider the "dashed line" connected components illustrated in FIG. 1. The output of cell 20b is presented to cell 20c after a delay of one sample period, $Z^{-1}$. The output of cell 20c is presented to summing means 22 through a gain or tap medium having a gain of −B. In doing so, the coefficients A and B may be empirically determined to provide an appropriate amount of compensation. It should also be noted that the gain between the output of cell 20a and summing means 22 is illustrated as being approximately equal to unity gain. This gain may also be regulated to provide a gain which would achieve better compensation based on empirical data.

FIG. 3 shows another embodiment of the invention where like components having the same intended function have the same numeral designations as illustrated in FIG. 1. In FIG. 3 the output of sampler 20 is presented to a "Pre-Compensation Compensator" 300 similar to the post-compensator of FIG. 1. In this embodiment, the output 21 of sampler 20 is presented to a cell $p_K$. A summing cell $Q_K$ sums the output of cell $p_{K-1}$, having a gain of −A as defined earlier, with the output of cell $p_K$. In this embodiment, cell 14 provides the compensated convolver output.

It should be recognized by one skilled in the art that one may use a post-compensator and a pre-compensator in one embodiment with suitably readjusted values for two "A values". Although not shown, it should be recognized by one skilled in the art that an automatic adjustment of the value of the gain "A" may be provided by automatic real-time mechanizations based on measuring/computing correlations so as to remove the correlations between adjacent in-time output samples. Lastly, although a criteria for A has been established herein, other formulations for the establishment of the gain "A" are within the spirit and scope of the present invention.

The post- or pre-compensator as illustrated herein may be considered to be a finite impulse response filter implementation. It is also within the scope of the present invention to provide an infinite impulse response version such as that illustrated in FIG. 4.

Figure 4:
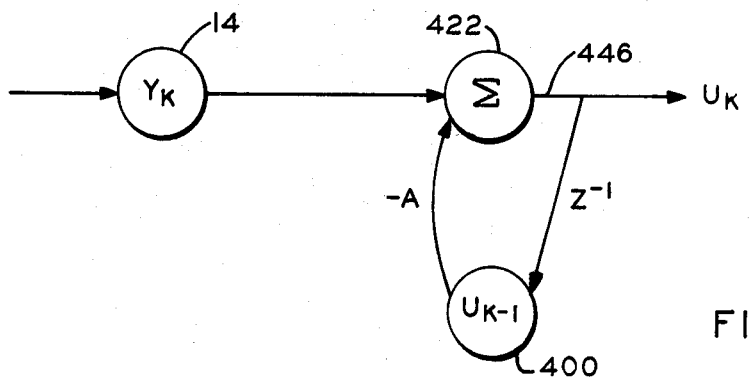
FIG. 4 is a state diagram illustrating an alternate arrangement of the invention.

In FIG. 4, the post-compensator comprises summing means 422 and sample and hold cell 400. In this situation, the output of summing means 14 is presented to summing means 422 which provides the convolver output. The convolver output 446 is presented to a sample and hold cell 400 for subsequent presentation back to summing means 422 but having gain −A. As before, the output of cell 422 is presented to cell 400 but delayed by one sample period. This type of compensation is typically used for what is referred to as an infinite impulse response filter.

The embodiments of the invention in which an exclusive property or right is claimed are defined as follows:
1. A charge transfer device comprising:
a series of charge coupled cells, $(X_K \ldots X_{K-(n-1)N})$, each having a capacitance for the storage of charge which represents information, at least one charge transfer control electrode, and each cell having an input means adapted to be coupled to an output of a preceding device;
sampling means for receiving an input signal and providing an output signal indicative of said input, said output signal being electrically applied to a first cell, $X_k$, of said series;
control means for applying at least one transfer control signal to said control electrodes in order to control transfer of charge from one cell to the next such that two adjacent cells represent signal values separated by at least one sample period;

means for providing a first sum of a weighted portion, ($W_0 \ldots W_{n-1}$, of each of said series of charge coupled cells; and means for subtracting from said first sum at least a second sum being said first sum at a previous sample period and weighted by a selected weighting coefficient related to the charge transfer inefficiency of said charged coupled cells and the number of cells in said series.

2. The charge transfer device of claim 1 wherein said subtracting means further comprises means for subtracting from said first sum an $n^{th}$ sum being said first sum at an $n^{th}$ previous sample period and weighted by a selected weighting coefficient related to the charge transfer inefficiency of said charge coupled cells and the number of cells in said series.

3. The charge transfer device comprising:

sampling means for receiving an input signal and providing an output signal indicative of said input, said output signal being electrically applied to a first holding cell, $P_k$;

means for providing a compensated output signal representative of the present sample, $P_{k-1}$, having subtracted there from the previous sample, $P_{k-1}$, corresponding to a previous sample period with said previous sample being weighted by a selected weighting coefficient;

a series of charge coupled cells $X_K \ldots X_{K-(n-1)}$, each having a capacitance for the storage of charge which represents information, at least one charge transfer control electrode, and each cell having an input means adapted to be coupled to an output of a preceding device, said compensated output signal being electrically applied to a first cell, $X_K$, of said series;

control means for applying a transfer control signal to said control electrodes in order to control transfer of charge from one cell to the next such that two adjacent cells represent signal values separated by at least one sample period; and means for providing a first sum of a weighted portion, $W_0 \ldots W_{n-1}$, of each of said series of charge coupled cells.

* * * * *